(12) United States Patent
Vaillant

(10) Patent No.: US 8,188,525 B2
(45) Date of Patent: May 29, 2012

(54) IMAGE SENSOR

(75) Inventor: Jerome Vaillant, Chambery (FR)

(73) Assignee: STMicroelectronics S.A., Montrouge (FR)

( * ) Notice: Subject to any disclaimer, the term of this patent is extended or adjusted under 35 U.S.C. 154(b) by 1082 days.

(21) Appl. No.: 11/436,990

(22) Filed: May 17, 2006

(65) Prior Publication Data

US 2006/0278906 A1  Dec. 14, 2006

Related U.S. Application Data

(63) Continuation-in-part of application No. PCT/FR2004/050585, filed on Nov. 12, 2004.

(30) Foreign Application Priority Data

Nov. 17, 2003 (FR) ...................................... 03 50844

(51) Int. Cl.
*H01L 31/062* (2012.01)
(52) U.S. Cl. ....................................................... 257/294
(58) Field of Classification Search ......................... None
See application file for complete search history.

(56) References Cited

U.S. PATENT DOCUMENTS 5,691,548 A   11/1997  Aoki
6,066,511 A    5/2000  Fukusyo
6,605,850 B1   8/2003  Katsuhito et al.
6,803,250 B1 * 10/2004  Yaung et al. ..................... 438/70
2006/0138480 A1 *  6/2006  Adkisson et al. ............. 257/291

FOREIGN PATENT DOCUMENTS

| EP | 1341235 A | 9/2003 |
| EP | 1685602 A2 | 8/2006 |
| FR | 2862426 A1 | 5/2005 |
| WO | 2005050741 A2 | 6/2005 |
| WO | 2005050741 A3 | 7/2005 |

OTHER PUBLICATIONS

French International Search Report re PCT application No. PCT/FR2004/050585 dated Jun. 17, 2005.

* cited by examiner

*Primary Examiner* — Cynthia H Kelly
*Assistant Examiner* — Anna Verderame
(74) *Attorney, Agent, or Firm* — Graybeal Jackson LLP

(57) ABSTRACT

An image sensor includes a substrate, transparent layers covering the substrate and delimiting an exposition surface exposed to light, separate photosensitive areas at the substrate level and, for each photosensitive area, a first optical means capable of deviating towards the photosensitive area light reaching a central region of a portion of the exposition surface. The sensor further includes, for each photosensitive area, a second optical means, separate from the first optical means, capable of deviating towards the photosensitive area light reaching a peripheral region of the portion of the exposition surface surrounding the central region.

30 Claims, 2 Drawing Sheets

IMAGE SENSOR

PRIORITY CLAIM

The present application is a Continuation-in-Part of International Patent Application No. PCT/FR2004/050585, filed Nov. 12, 2004, which application claims the benefit of French Patent Application No. 03/50844, filed Nov. 17, 2003; all of the foregoing applications are incorporated herein by reference in their entireties.

TECHNICAL FIELD

An embodiment relates to an image sensor, and in particular, to a CMOS-type image sensor formed of an array of photosensitive cells arranged in lines and columns.

BACKGROUND

FIG. 1 schematically shows a cross-section of two adjacent photosensitive cells 10, 12 of a conventional CMOS-type image sensor formed on a substrate 13. Such a sensor corresponds, for example, to the sensor sold by STMicroelectronics under the trade name "CMOS Image Sensor Module VS6552". Each photosensitive cell 10, 12 is associated with a portion of the surface of substrate 13 which, in a top view, generally has the shape of a square or of a rectangle. Each photosensitive cell 10, 12 includes an active photosensitive area 14, 16, generally corresponding to a photodiode adapted to storing a quantity of electric charges according to the received light intensity. Substrate 13 is covered with a stacking of insulating and transparent layers 18, for example, formed of silicon oxide. Conductive tracks 20, formed on the surface of substrate 13 and between adjacent insulating layers, and conductive vias 22, formed through insulating layers 18, especially enable addressing photosensitive areas 14, 16 and collecting electric signals provided by photosensitive areas 14, 16. Conductive tracks 20 and conductive vias 22 are generally formed of reflective or absorbing materials. In a color sensor, a color filter element, for example, an organic filter 24, 26, is arranged at the surface of the stacking of insulating layers 18 at the level of each photosensitive cell 10, 12. The elements of color filter 24, 26 are generally covered with a planarized equalizing layer 27 which defines an exposition surface 28 exposed to light.

Photosensitive area 14, 16 generally does not cover the entire surface of substrate 13 associated with photosensitive cell 10, 12. Indeed, a portion of the surface is reserved to devices for addressing and reading from photosensitive area 14. A photosensitive area 14 generally covers approximately 30% of the surface of substrate 13 associated with photosensitive cell 10, 12. To increase the light intensity reaching the photosensitive area of a photosensitive cell, a microlens 29, 30 is arranged on equalizing layer 27, opposite to photosensitive area 14, 16 to focus the light beams towards photosensitive area 14, 16. The paths followed by three light beams R1, R2, R3 are schematically shown as an example in stripe-dot lines for photosensitive cells 10, 12. Conductive tracks 20 and conductive vias 22 are arranged to avoid hindering the passing of the light beams.

Microlenses 29, 30 are generally obtained by covering equalizing layer 27 with a resin, etching the resin to define separate resin blocks, each resin block being formed substantially opposite to a photosensitive area 14, 16, by heating the resin blocks. Each resin block then tends to deform by reflow, the center of the block inflating and the lateral walls collapsing, to obtain a convex external surface 32, 34. The external surface 32, 34 desired to ensure an optimal focusing of the light beams towards a photosensitive area corresponds to a portion of a sphere having its radius varying proportionally to the distance separating a microlens 29, 30 from the associated photosensitive area 14, 16. As an example, for a photosensitive cell 10, 12 with a 4-micrometer side and for a distance on the order of from 8 to 10 micrometers between a microlens 29, 30 and the associated photosensitive area 14, 16, the maximum thickness of the microlens 29, 30 is approximately ½ micrometer.

The previously-described method of manufacturing microlenses 29, 30, however, does not enable obtaining a microlens 29, 30 filling the entire portion of the exposition surface associated with the photosensitive cells. Indeed, the resin blocks from which microlenses 29, 30 are formed must be separated from one another by separation regions 36 surrounding each resin block, the minimum width of which especially depends on the used etch techniques and on the used resin type. For conventional etch techniques, separation regions 36 have a minimum width from approximately 0.4 to 0.5 micrometer, which substantially corresponds to 10% of the side of a photosensitive cell. Separation regions 36 are maintained after forming microlenses 29, 30. A circular resin block enables obtaining a microlens 29, 30 having an external surface substantially corresponding to a spherical portion. However, to reduce separation regions 36 to a minimum while keeping an external microlens surface relatively close to a spherical portion, a resin block having, as seen from above, the shape of a square or of a rectangle with tapered angles, is generally used. The light arriving at the level of separation regions 36 associated with a photosensitive cell is not focused towards photosensitive area 14, 16, which reduces the sensor's sensitivity.

A solution to increase the light intensity focused towards the photosensitive area of a photosensitive cell is to provide an additional so-called "top-coating" step, which includes the conformal deposition of a transparent material (not shown), for example, silicon nitride, on microlenses 29, 30. The external surface of the conformal deposition follows the shape of microlenses 29, 30 and forms the light-focusing surface. The conformal deposition then provides a focusing surface including dished areas at the level of each microlens 29, 30. Two adjacent dished areas are separated by a minimum distance less than the minimum width of the separation region between the two associated microlenses. When the conformal deposition has a sufficient thickness, the dished surfaces can be contiguous.

To increase the sensitivity of an image sensor, it is desirable to increase the number of photosensitive cells forming it. However, it is not desirable for the total surface area taken up by the sensor to excessively increase. It is thus desirable to decrease the surface area of a photosensitive cell. This imposes decreasing the surface area of the photosensitive area of each photosensitive cell. The sensitivity of each photosensitive cell is decreased since the photosensitive area of the photosensitive cell receives a lower and lower light intensity. The optimizing of the amount of light received by the photosensitive area of a photosensitive cell with respect to the amount of light received by the portion of the exposition surface associated with the photosensitive cell then becomes an important factor.

The performing of a conformal deposition increases the distance between each dished area and the associated photosensitive area. The more distant a dished area is from the associated photosensitive area, the higher its radius of curvature must be to ensure a proper focusing of the light beams towards the photosensitive area. This requires the forming of a microlens, itself having a high radius of curvature. The radius of curvature of a microlens is inversely proportional to the thickness of the resin block from which the microlens originates. However, the lower the thickness of a resin block, the more difficult it is to accurately control the radius of curvature of the finally-obtained microlens.

Furthermore, at small scales, it is difficult to form a perfectly conformal deposition and thus ensure for the external surface of the conformal deposition to accurately follow the convex surface of the microlenses.

SUMMARY

An embodiment provides an image sensor formed of an array of photosensitive cells enabling focusing, for each photosensitive area, as much light intensity received by the photosensitive cell as possible towards the photosensitive area of the photosensitive cell.

Another embodiment provides an image sensor including separate photosensitive areas at the level of a substrate, with an exposition surface exposed to light; and, for each photosensitive area, optical means capable of deviating towards the photosensitive area light reaching a peripheral region of a portion of the exposition surface associated with the photosensitive area.

According to another embodiment, the image sensor including a substrate; separate photosensitive areas at the substrate level; transparent layers covering the substrate and delimiting an exposition surface exposed to light; a first optical means, for each photosensitive area, capable of deviating towards the photosensitive area light reaching a central region of a portion of the exposition surface associated with the photosensitive area; and a second optical means, for each photosensitive area, capable of deviating towards the photosensitive area light reaching a peripheral region of the portion of the exposition surface surrounding the central region.

According to a further embodiment, the second optical means is arranged at an intermediary level between the exposition surface and the substrate.

According to a further embodiment, the first optical means includes a microlens arranged at the level of the central region.

According to a further embodiment, the second optical means includes refringent surfaces inclined with respect to the exposition surface delimited by a first transparent layer having a first refraction coefficient in contact with a second transparent layer having a second refraction coefficient greater than the first refraction coefficient, the first and second transparent layers being arranged at an intermediary level between the exposition surface and the substrate.

According to a further embodiment, the refringent surfaces are at least partly planar.

According to a further embodiment, the refringent surfaces are arranged, for each photosensitive area, opposite to the peripheral region.

Another embodiment provides a method for forming an image sensor, including the steps of forming separate photosensitive areas at the level of a substrate; forming a stacking of transparent layers, including a first transparent layer having a first refraction coefficient in contact with a second transparent layer having a second refraction coefficient greater than the first refraction coefficient, the first and second transparent layers delimiting at least partly planar refringent surfaces capable of deviating light towards the photosensitive areas; forming an exposition surface exposed to light, the refringent surfaces being inclined with respect to the exposition surface; and forming separate microlenses on the exposition surface, each microlens being capable of deviating light towards a photosensitive area, the microlenses being separated by separation regions arranged opposite to the refringent surfaces.

According to a further embodiment, the second transparent layer covers the first transparent layer and is planarized.

According to a further embodiment, the first transparent layer is formed of the same material as other transparent layers.

BRIEF DESCRIPTION OF THE DRAWINGS

The foregoing features and advantages of the present disclosure will be discussed in detail in the following non-limiting description of specific embodiments in connection with the accompanying drawings.

DETAILED DESCRIPTION

Figure 1:
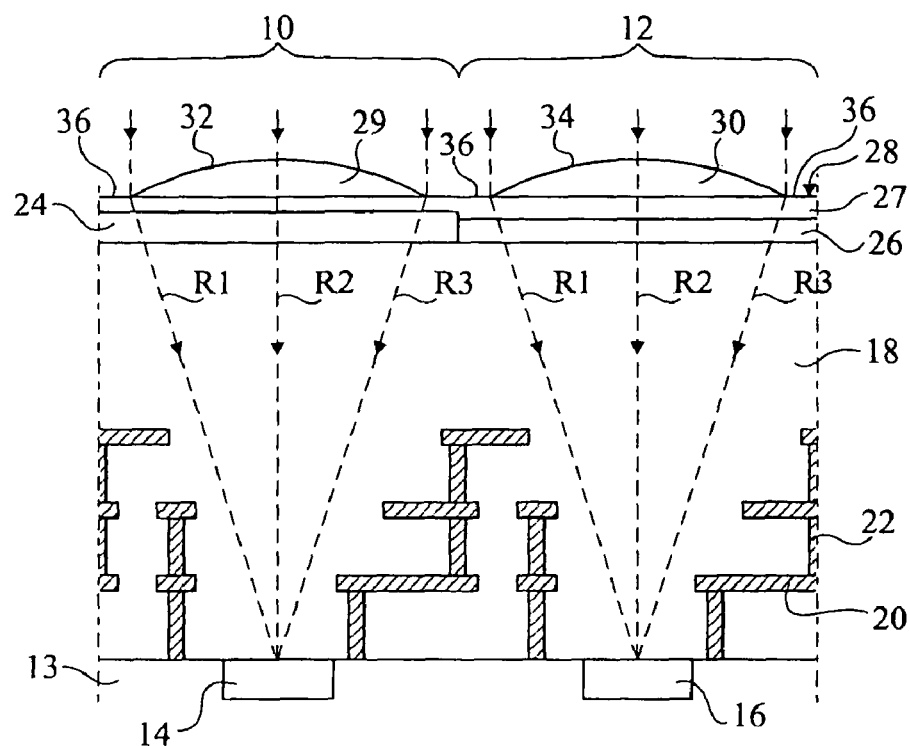
FIG. 1 schematically shows a cross-section view of two adjacent photosensitive cells of a conventional image sensor.

The following discussion is presented to enable a person skilled in the art to make and use the embodiments described in the present disclosure. Various modifications to the embodiments will be readily apparent to those skilled in the art, and the generic principles herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

An embodiment includes providing, in the stacking of insulating layers 18, opposite to the separation regions 36 surrounding microlens 29, 30 of each photosensitive cell 10, 12, a refringent surface capable of deviating the light beams which reach the portion of exposition surface 28 associated with photosensitive cell 10, 12 towards photosensitive area 14, 16 of photosensitive cell 10, 12. The light beams usually focused towards photosensitive area 14, 16 by microlens 29, 30 are then combined with the light beams which reach the portion of exposition surface 28 associated with photosensitive cell 10, 12 at the level of separation regions 36. Almost all of the light reaching the portion of exposition surface 28 associated with photosensitive cell 10, 12 is then oriented towards photosensitive area 14, 16 of photosensitive cell 10, 12.

Figure 2:
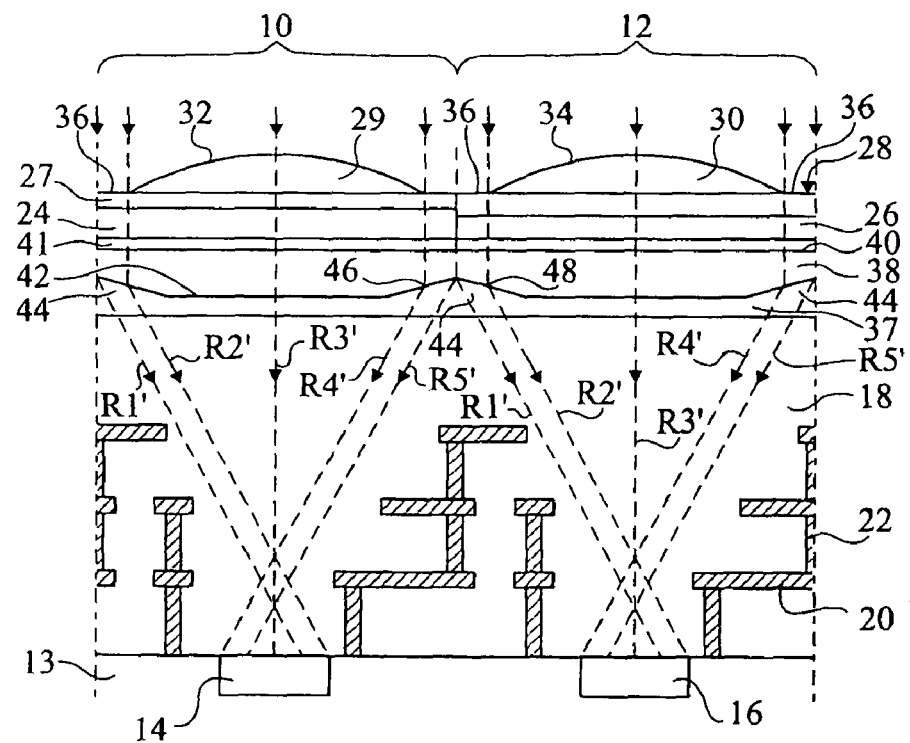
FIG. 2 schematically shows a cross-section view of two adjacent photosensitive cells of an image sensor according to a first embodiment.

FIG. 2 shows a first embodiment of a sensor. A first transparent insulating layer 37 having a small refraction coefficient on which is formed a second transparent insulating layer 38 having a greater refraction coefficient is provided in the stacking of insulating layers 18. As an example, layer 37 with a small refraction coefficient is formed of silicon oxide, the refraction coefficient of which is on the order of from 1.5 to 1.6 and layer 38 with a high refraction coefficient is formed of silicon nitride having a refraction coefficient on the order of 2. Low-refraction coefficient layer 37 may be formed of the same material as that forming insulating layers 18 in which are formed previously-described conductive tracks 20 and conductive vias 22.

Upper surface 40 of high-refraction coefficient layer 38, opposite to filter elements 24, 26, is planarized and forms a first refringent surface. An insulating and transparent layer 41 may be provided between layer 38 and filter elements 24, 26. Surface 42 at the interface between high-refraction coefficient layer 38 and low-refraction coefficient layer 37 forms a second refringent surface. Low refraction coefficient layer 37 includes protuberances 44 which each define two inclined planar surfaces 46, 48 of the second refringent surface 42. Each protuberance 44 is substantially formed opposite to a separation region 36 between two adjacent microlenses 29, 30. The junction line between two inclined planar surfaces 46, 48 is substantially arranged at the level of the separation between two adjacent photosensitive cells 10, 12. The light beams which reach separation region 36 according to a direction substantially perpendicular to exposition surface 28 cross filter elements 24, 26, layer 41, and first refringent surface 40 without being deviated given their 90° angle of incidence. They are then deviated by one or the other of inclined planar surfaces 46, 48 by a determined deviation angle which depends on the refraction coefficients of layers 37, 38 and on the inclination of inclined planar surfaces 46, 48. The deviation angle is chosen so that all of the light beams which reach the portion of separation region 36 associated with a photosensitive cell are deviated by an inclined surface 46, 48 towards photosensitive area 14 of photosensitive cell 10, 12. As an illustration, for each photosensitive cell 10, 12, the path followed by five light beams R1' to R5' are shown in FIG. 2. In the case where low-refraction coefficient layer 37 is formed of silicon oxide, there is no additional deviation of the light beams crossing layer 37 and the underlying layers formed of the same material.

Protuberances 44 may be obtained by a method in which layer 37 is formed by carrying out, in parallel, adapted steps of deposition and etch to form inclined planar surfaces 46, 48 according to a desired inclination.

Figure 3:
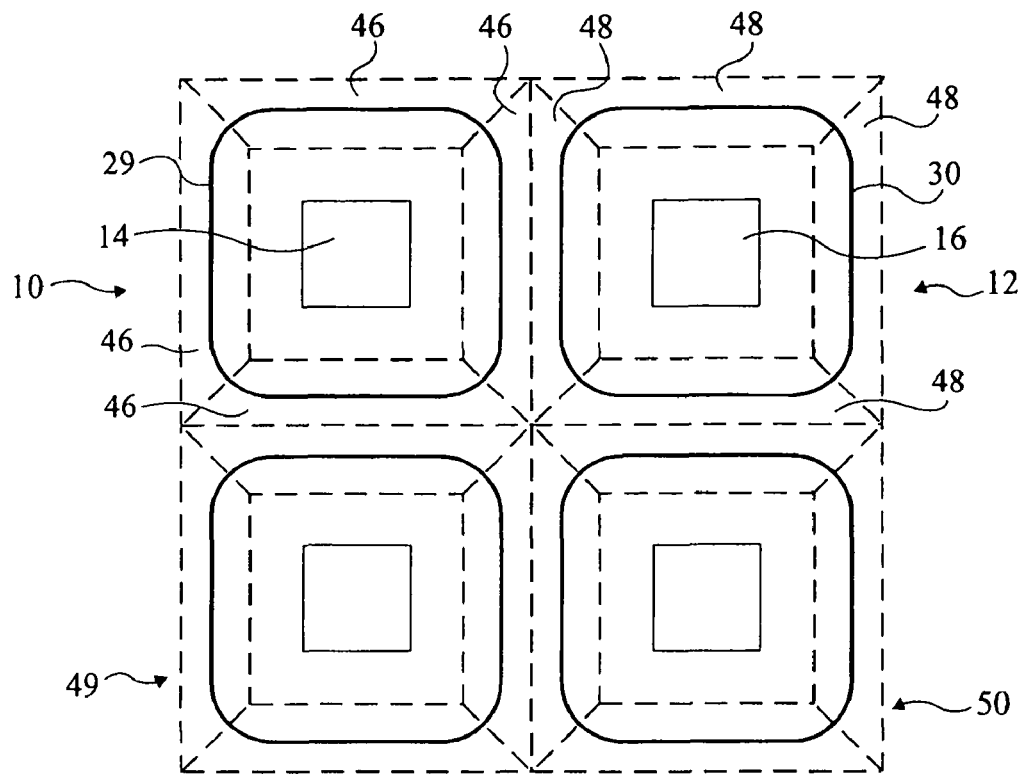
FIG. 3 schematically shows a top view of four adjacent photosensitive cells of an image sensor according to the first embodiment.

FIG. 3 schematically shows a top view of the two photosensitive cells 10, 12 and of two other adjacent photosensitive cells 49, 50 enabling appreciating the relative positions between photosensitive areas 14, 16 (shown in thin full lines), microlenses 29, 30 (shown in thick full lines), and inclined planar surfaces 46, 48 (shown in dotted lines).

Figure 4:
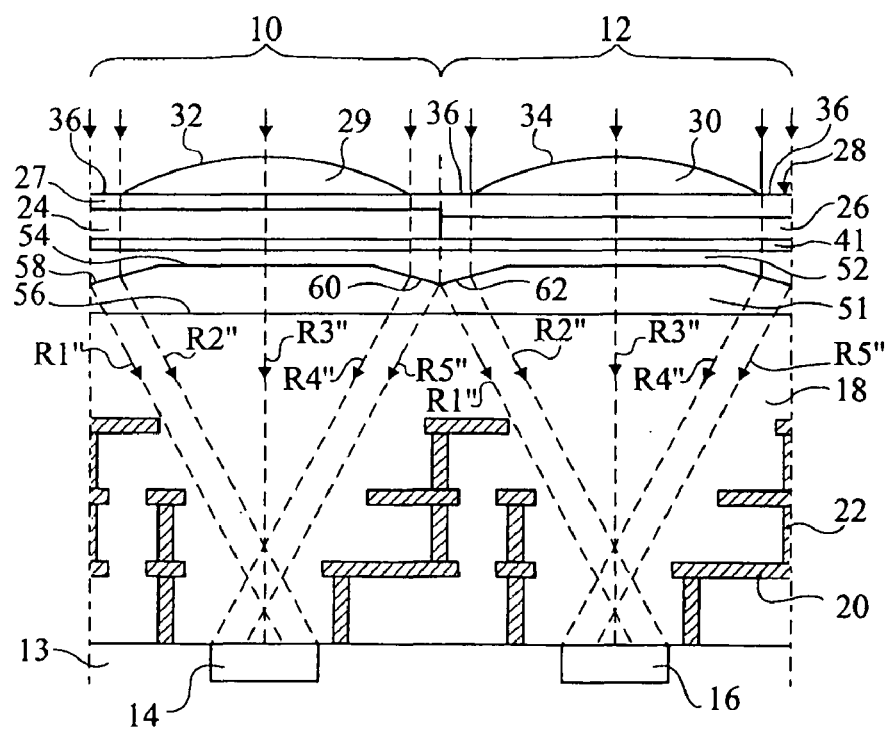
FIG. 4 schematically shows a cross-section view of two adjacent photosensitive cells of an image sensor according to a second embodiment.

FIG. 4 shows an image sensor according to a second embodiment. A first trans-parent insulating layer 51 having a high refraction coefficient, on which is formed a second transparent insulating layer 52 having a lower refraction coefficient, is provided in the stacking of insulating layers 18.

Surface 54 at the interface between low-refraction coefficient layer 52 and high-refraction coefficient layer 51 forms a first refringent surface. Lower surface 56 of high refraction coefficient layer 51, at the interface with the stacking of insulating layers 18, forms a second refringent surface. High-refraction coefficient layer 51 includes recesses 58 which each define two inclined planar surfaces 60, 62 of the first refringent surface 54. Each recess 58 is formed substantially opposite to a separation region 36 between two microlenses 29, 30. The junction line between two inclined planar surfaces 60, 62 is substantially arranged at the level of the separation between two adjacent photosensitive cells. The light beams which reach separation region 36 according to a direction substantially perpendicular to exposition surface 28 cross filter elements 24, 26, layer 41, and low refraction coefficient layer 52 without being deviated given their 90° angle of incidence. They are then deviated by one or the other of inclined surfaces 60, 62 of second refringent surface 54 by a determined deviation angle which depends on the refraction coefficients of layers 51, 52 and on the inclination of inclined surfaces 60, 62. The light beams then undergo an additional refraction (not shown) by crossing second refringent surface 56.

The total deviation applied to the light beams reaching separation regions 36 is selected so that all of the light beams that reach the portion of separation region 36 associated with a photosensitive cell are deviated to photosensitive area 14 of the photosensitive cell. As an illustration, for each photosensitive cell 10, 12, the paths followed by five light beams R1" to R5" are shown in FIG. 4. It is advantageous to have, in the two previously-described embodiments, layers 37, 38, 51, 52 with low and high refraction coefficients close to filter elements 24, 26. Indeed, the deviation to be applied to the light beams then is the smallest. However, if necessary, the layers with low and high refraction coefficients 37, 38, 51, 52 can be arranged anywhere in the stacking of insulating layers 18, with tracks 20 and conductive vias 22 being, however, likely to hinder the passing of the light beams.

It is necessary to take into account the angular deviations due to layers 37, 38, 51, 52 to determine the path followed by the light beams focused by microlenses 29, 30. To simplify the determination of the travel of the light beams, it may be preferable for the light beams passing substantially at the level of the contour of a microlens 29, 30 to reach, in the first embodiment, second refringent surface 42 outside of protuberances 44 and, in the second embodiment, first refringent surface 54 outside of recesses 58.

According to a third embodiment, microlenses 29, 30 are replaced with a layer having a refraction coefficient different from that of the underlying insulating layer and having, at the level of the central region of the portion of exposition surface 28 associated with a photosensitive cell 10, 12, a juxtaposition of planar surfaces inclined in such a way that the light beams reaching each inclined planar surface are deviated towards the photosensitive area of the photosensitive cell.

Image sensors according to the described embodiments may be utilized in a variety of different types of electronic devices, such as digital cameras, camcorders, cellular phones, personal digital assistants (PDAs), and so on.

Of course, the embodiments described in the present disclosure are likely to have various alterations, modifications, and improvements which will readily occur to those skilled in the art. In particular, inclined planar surfaces for deviating the light beams towards the photosensitive area of a photosensitive cell have been described. These may, however, be more complex surfaces, for example, concave or convex surfaces.

Such alterations, modifications, and improvements are intended to be part of this disclosure, and are intended to be within the spirit and the scope of the present disclosure. Accordingly, the foregoing description is by way of example only and is not intended to be limiting.

What is claimed is:

1. An image sensor, comprising:
a substrate;
a plurality of photosensitive areas at a level of the substrate;
a substantially planar exposition surface having a plurality of substantially planar central and peripheral regions, each peripheral region surrounding a central region, and each central region and each peripheral region corresponding to one of the plurality of photosensitive areas;
a first optical means formed over each central region and being surrounded by a corresponding peripheral region, each first optical means being capable of deviating light reaching the first optical means towards the corresponding photosensitive area; and
a second optical means capable of deviating light that is perpendicular to the plane of each peripheral region surrounding a corresponding first optical means, and is incident on the peripheral region, towards the corresponding photosensitive area.

2. The image sensor of claim 1, wherein the second optical means is arranged at an intermediary level between the exposition surface and the substrate.

3. The image sensor of claim 1, wherein each first optical means comprises a microlens arranged at a level of the central region.

4. The image sensor of claim 1, wherein the second optical means comprises refringent surfaces inclined with respect to the exposition surface, the exposition surface delimited by a first transparent layer having a first refraction coefficient in contact with a second transparent layer having a second refraction coefficient greater than the first refraction coefficient, the first and second transparent layers being arranged at an intermediary level between the exposition surface and the substrate.

5. The image sensor of claim 4, wherein the refringent surfaces are at least partly planar.

6. The image sensor of claim 4, wherein the refringent surfaces are arranged opposite to a corresponding peripheral region.

7. An image sensor, comprising:
first and second photosensitive areas;
an exposition surface having first and second central regions respectively associated with the first and second photosensitive areas, the first and second central regions having first and second microlenses, respectively, formed thereon, and the exposition surface further including first and second peripheral regions respectively surrounding the first and second central regions and the peripheral regions also surrounding the first and second microlenses formed thereon;
wherein the first microlens is operable to focus light reaching the first microlens towards the first photosensitive area and wherein the second microlens is operable to focus light reaching the second microlens towards the second photosensitive area; and
wherein the image sensor further includes,
a first optical component operable to focus orthogonal light reaching the first peripheral region towards the first photosensitive area, and
a second optical component operable to focus orthogonal light reaching the second peripheral region towards the second photosensitive area.

8. The image sensor of claim 7, wherein the first and second optical components are arranged between the exposition surface and the first and second photosensitive areas.

9. The image sensor of claim 7, wherein
the first and second optical components comprise a first transparent layer having a refringent surface.

10. The image sensor of claim 9, wherein at least a portion of the refringent surface is inclined with respect to the exposition surface.

11. The image sensor of claim 9, wherein the first and second optical components further comprise a second transparent layer in contact with the refringent surface.

12. The image sensor of claim 11, wherein a refraction coefficient of the first transparent layer is greater than a refraction coefficient of the second transparent layer.

13. The image sensor of claim 11, wherein a refraction coefficient of the second transparent layer is greater than a refraction coefficient of the first transparent layer.

14. The image sensor of claim 9, wherein the inclined portion of the refringent surface is at least partly planar.

15. The image sensor of claim 10, wherein the inclined portion of the refringent surface is arranged opposite a corresponding peripheral region.

16. An electronic system, comprising:
an electronic device including an image sensor, the image sensor including:
first and second photosensitive areas;
an exposition surface having first and second central regions respectively associated with the first and second photosensitive areas, the first and second central regions having first and second microlenses arranged on the first and second regions, respectively, and the exposition surface further including first and second separation regions corresponding to portions of the exposition surface surrounding the periphery of the first and second microlenses;
wherein the first microlens is operable to direct light reaching the first microlens towards the first photosensitive area and wherein the second microlens is operable to direct light reaching the second microlens towards the second photosensitive area; and
wherein the image sensor further includes,
a first optical component operable to direct light incident upon the first separation region at an angle orthogonal to a plane of the first separation region towards the first photosensitive area, and
a second optical component operable to direct light incident upon the second separation region at an angle orthogonal to a plane of the second separation region towards the second photosensitive area.

17. The electronic system of claim 16, wherein the electronic device comprises a digital camera.

18. The electronic system of claim 16, wherein the electronic device comprises a camcorder.

19. The electronic system of claim 16, wherein the electronic device comprises a cellular phone.

20. The electronic system of claim 16, wherein the electronic device comprises a personal digital assistant (PDA).

21. A method of routing light incident upon a plurality of microlenses arranged in an array on an exposition surface to a plurality of photosensitive regions, the method comprising:
routing light incident upon each of the microlenses towards a corresponding photosensitive region; and
routing light incident upon and perpendicular to a portion of the exposition surface surrounding each microlens and on which no microlens is formed towards the same photosensitive region to which the corresponding microlens routes light.

22. The image sensor of claim 1, further comprising transparent layers covering the substrate and delimiting the exposition surface.

23. An image sensor, comprising:
a substrate;
a plurality of photosensitive areas at a level of the substrate;
a substantially planar exposition surface having a plurality of substantially planar central and peripheral regions, each peripheral region surrounding a central region, and each central region and each peripheral region corresponding to one of the plurality of photosensitive areas;
a first optical component formed over each central region and being surrounded by a corresponding peripheral region, each first optical component being capable of deviating light reaching the first optical component towards the corresponding photosensitive area; and
a second optical component capable of deviating incident light striking the plane of each peripheral region, where the incident light is perpendicular to the plane of the peripheral region, towards the corresponding photosensitive area.

24. The image sensor of claim 23, wherein
the second optical component is arranged at an intermediary level between the exposition surface and the substrate.

25. The image sensor of claim 23, wherein each first optical component comprises a microlens arranged at a level of the central region.

26. The image sensor of claim 23, wherein the second optical component comprises:
refringent surfaces inclined with respect to the exposition surface,
wherein the exposition surface is delimited by a first transparent layer having a first refraction coefficient in contact with a second transparent layer having a second refraction coefficient greater than the first refraction coefficient, and
wherein the first and second transparent layers are arranged at an intermediary level between the exposition surface and the substrate.

27. The image sensor of claim 26, wherein the refringent surfaces are at least partly planar.

28. The image sensor of claim 26, wherein the refringent surfaces are arranged opposite to a corresponding peripheral region.

29. An image sensor, comprising:
first and second photosensitive areas;
an exposition surface having first and second central regions respectively associated with the first and second photosensitive areas, the first and second central regions having first and second microlenses, respectively, formed thereon, and the exposition surface further including first and second peripheral regions respectively surrounding the first and second central regions and the peripheral regions also surrounding the first and second microlenses formed thereon;
wherein the first microlens is operable to focus light reaching the first microlens towards the first photosensitive area and wherein the second microlens is operable to focus light reaching the second microlens towards the second photosensitive area; and
wherein the image sensor further includes,
a first optical component operable to focus orthogonal light reaching the first peripheral region towards the first photosensitive area, and
a second optical component operable to focus orthogonal light reaching the second peripheral region towards the second photosensitive area.

30. A method, comprising:
routing light incident upon each of a plurality of microlenses arranged in an array on an exposition surface towards a corresponding one of a plurality of photosensitive regions; and
routing orthogonal light incident on a portion of the exposition surface surrounding each microlens and on which no microlens is formed towards the same photosensitive region to which the corresponding microlens routes light.

* * * * *